United States Patent
Manzano et al.

(10) Patent No.: US 11,071,215 B1
(45) Date of Patent: Jul. 20, 2021

(54) CASE FOR PORTABLE ELECTRONIC COMPUTING DEVICE

(71) Applicant: Pioneer Square Brands, Inc., Seattle, WA (US)

(72) Inventors: Megan Elizabeth Zumel Manzano, Seattle, WA (US); Jaimie Emerald Chan, Renton, WA (US); Brian Lewis Piper, Seattle, WA (US)

(73) Assignee: PIONEER SQUARE BRANDS, INC., McLean, VA (US)

( * ) Notice: Subject to any disclaimer, the term of this patent is extended or adjusted under 35 U.S.C. 154(b) by 0 days.

(21) Appl. No.: 17/231,512

(22) Filed: Apr. 15, 2021

(51) Int. Cl.
  *H05K 5/00* (2006.01)
  *G06F 1/16* (2006.01)
  *H05K 5/02* (2006.01)

(52) U.S. Cl.
  CPC ......... *H05K 5/0056* (2013.01); *G06F 1/1633* (2013.01); *H05K 5/0217* (2013.01)

(58) Field of Classification Search
  None
  See application file for complete search history.

(56) References Cited

U.S. PATENT DOCUMENTS

| | | | | |
|---|---|---|---|---|
| 7,033,098 B2 * | 4/2006 | Linyear | ..................... | B42F 7/14 400/714 |
| 7,557,312 B2 * | 7/2009 | Clark | .................... | G06F 3/0202 200/5 A |
| 8,851,771 B2 * | 10/2014 | Kaliebe | ................. | G06F 3/0202 400/490 |
| 8,867,202 B2 * | 10/2014 | Williams | .............. | G06F 1/1632 361/679.41 |
| 9,241,552 B2 * | 1/2016 | Hunter | .................... | A45C 11/00 |
| 9,795,213 B1 * | 10/2017 | Vier | .................... | F16M 11/2021 |
| 10,345,920 B2 * | 7/2019 | Stoops | .................. | G06F 3/0202 |
| 10,372,169 B1 * | 8/2019 | Ferren | .................. | G06F 1/1669 |
| 10,466,807 B1 * | 11/2019 | Ferren | .................. | G06F 3/0202 |
| 10,698,452 B2 * | 6/2020 | Fenton | ................... | G06F 1/166 |
| 10,824,202 B2 * | 11/2020 | Okada | .................. | G06F 1/1656 |
| 10,845,844 B1 * | 11/2020 | Chan | ..................... | G06F 1/1628 |
| 2003/0002910 A1 * | 1/2003 | Jeffries | ................. | G06F 3/0202 400/714 |
| 2005/0200608 A1 * | 9/2005 | Ulla | ...................... | G06F 1/1626 345/168 |
| 2010/0276316 A1 * | 11/2010 | Hu | ....................... | A45C 13/005 206/320 |
| 2012/0314354 A1 * | 12/2012 | Rayner | ................... | H04M 1/18 361/679.01 |
| 2015/0062787 A1 * | 3/2015 | Wilson | ................. | H04M 1/185 361/679.01 |
| 2016/0088750 A1 * | 3/2016 | Wu | ...................... | F16M 11/105 248/688 |
| 2016/0309010 A1 * | 10/2016 | Carnevali | ............. | G06F 1/1628 |
| 2020/0076057 A1 * | 3/2020 | Leutheuser | .......... | H05K 5/0004 |

\* cited by examiner

Primary Examiner — Xanthia C Cunningham
(74) Attorney, Agent, or Firm — Grandview Law

(57) ABSTRACT

Systems and methods are involved with a case assembly a side; a cushion member including a side portion extending along a portion of the side, the cushion member including a first surface, a second surface, a first thickness extending a depth from the first surface to the second surface, and at least one trench having a depth from the first surface partially toward the second surface without penetrating the second surface. In addition, other aspects are described in the claims, drawings, and text forming a part of the present disclosure.

20 Claims, 10 Drawing Sheets

CASE FOR PORTABLE ELECTRONIC COMPUTING DEVICE

SUMMARY

In one or more aspects, an apparatus can include, but is not limited to a back side; a left side; a front side; a right side; a first cushion member including a left side portion extending along a portion of the left side, and a front side portion extending along a portion of the front side, the first cushion member including a top surface, a bottom surface, a first thickness extending a first depth from the top surface, to the bottom surface, and a trench (e.g., elongated trench) having a depth (e.g., third depth) from the top surface no more than partially toward the bottom surface; and a second cushion member including a right side portion extending along a portion of the right side, and a front side portion extending along a portion of the front side, the second cushion member including a top surface, a bottom surface, a first thickness extending a first depth from the top surface, to the bottom surface, and a trench (e.g., elongated trench) having a depth (e.g., third depth) from the top surface no more than partially toward the bottom surface. The first depth of the first cushion member can be less than half the first depth of the first thickness of the first cushion member. The first depth of the first cushion member can be less than 20% the first depth of the first thickness of the first cushion member. The first depth of the first cushion member can be less than 5 mm. The second cushion member can include a total front side length (e.g., first length) extending along at least 25% of the front side. The second cushion member can include a total front side length (e.g., first length) extending along the front side and the trench (e.g., elongated trench) of the second cushion member has a length at least 50% as long as the total front side length (e.g., first length) of the second cushion member. The second cushion member can include a total front side length (e.g., first length) extending along the front side and the trench (e.g., elongated trench) of the second cushion member has a length at least 30% as long as the total front side length (e.g., first length) of the second cushion member. The second cushion member can include an exterior edge (e.g., corner surface), and wherein the trench (e.g., elongated trench) of the second cushion member can have a width (e.g., first width) and is spaced from the exterior edge (e.g., corner surface) of the second cushion member at least 75% of the width (e.g., first width) of width (e.g., first width). The second cushion member can have a width (e.g., the sum of first width, second width, and third width) and wherein the trench (e.g., elongated trench) of the second cushion member can have a width (e.g., first width) less than half of the width of the width of the second cushion member (e.g., the sum of first width, second width, and third width). The second cushion member can have a width (e.g., the sum of first width, second width, and third width) and wherein the trench (e.g., elongated trench) of the second cushion member can have a width (e.g., first width) less than a quarter of the width of the width of the second cushion member (e.g., the sum of first width, second width, and third width). The second cushion member can include a plurality trenches (e.g., elongated trench and elongated trench) with depths (e.g., third depth) from the top surface no more than partially toward the bottom surface. The second cushion member can include a curvilinear trench (e.g., curvilinear) with a depth (e.g., second depth) from the top surface no more than partially toward the bottom surface. The curvilinear trench (e.g., curvilinear) of the second cushion member can be shaped according to a first arc angle (e.g., first arc angle) and wherein the second cushion member can include a corner shaped according to a second arc angle (e.g., second arc angle), the first arc angle (e.g., first arc angle) can be within 20% of the second arc angle (e.g., second arc angle). The first cushion member can include a passage extending from the top surface of the first cushion member to the bottom surface of the first cushion member. The trench (e.g., curvilinear trench) of the first cushion member can have a width (e.g. similar to width of curvilinear trench) and can be spaced from the passage of the first cushion member less than or equal to the width of the trench (e.g., curvilinear trench). The first cushion member can be at least partially made from thermoplastic polyurethane.

In one or more aspects an apparatus can include, but is not limited to a first side (e.g., left side); a second side (e.g., front side); a third side (e.g., right side); a first cushion member including a first side portion extending along a portion of the first side (e.g., left side), and a second side portion extending along a portion of the second side (e.g., front side), the first cushion member can include a first surface (e.g., top surface), a second surface (e.g., bottom surface), a first thickness extending a first depth from the first surface (e.g., top surface), to the second surface (e.g., bottom surface), and a plurality of trenches (e.g., elongated trench) each having a depth (e.g., third depth) from the first surface (e.g., top surface) partially toward the second surface (e.g., bottom surface); and a second cushion member can include a first side portion extending along a portion of the third side (e.g., right side), and a second side portion extending along a portion of the second side (e.g., front side), the second cushion member can include a first surface (e.g., top surface), a second surface (e.g., bottom surface), a first thickness extending a first depth from the first surface (e.g., top surface), to the second surface (e.g., bottom surface), and a plurality of trenches (e.g., elongated trench) each having a depth (e.g., third depth) from the first surface (e.g., top surface) no more than partially toward the second surface (e.g., bottom surface). The second cushion member can include a total second side length (e.g., first length) extending along the second side (e.g., front side) and at least one of the plurality of trenches (e.g., elongated trench) of the second cushion member has a length at least 50% as long as the total second side length (e.g., first length) of the second cushion member.

In one or more aspects an apparatus can include, but is not limited to a side (e.g., front side); a cushion member (e.g., first cushion member) including a side portion extending along a portion of the side (e.g., front side), the cushion member (e.g., first cushion member) including a first surface (e.g., top surface), a second surface (e.g., bottom surface), a first thickness extending a depth (e.g., first depth) from the first surface (e.g., top surface), to the second surface (e.g., bottom surface), and at least one trench (e.g., elongated trench) having a depth (e.g., third depth) from the first surface (e.g., top surface) partially toward the second surface (e.g., bottom surface) without penetrating the second surface (e.g., bottom surface). The cushion member (e.g., second cushion member) can have a width (e.g., the sum of first width, second width, and third width) and wherein the at least one trench (e.g., elongated trench) of the cushion member (e.g., second cushion member) has a width (e.g., first width) less than a quarter of the width of the width (e.g., the sum of first width, second width, and third width) of the cushion member (e.g., second cushion member).

In addition to the foregoing, other aspects are described in the claims, drawings, and text forming a part of the disclosure set forth herein. Various other aspects are set forth and described in the teachings such as text (e.g., claims and/or detailed description) and/or drawings of the present disclosure. The foregoing is a summary and thus may contain simplifications, generalizations, inclusions, and/or omissions of detail; consequently, those skilled in the art will appreciate that the summary is illustrative only and is NOT intended to be in any way limiting. Other aspects, features, and advantages of the devices and/or processes and/or other subject matter described herein will become apparent in the teachings set forth herein.

BRIEF DESCRIPTION OF THE FIGURES

For a more complete understanding of implementations, reference now is made to the following descriptions taken in connection with the accompanying drawings. The use of the same symbols in different drawings typically indicates similar or identical items, unless context dictates otherwise.

With reference now to the figures, shown are one or more examples of an accessory coupling system articles of manufacture, compositions of matter, systems for producing and/or methods for producing same that may provide context, for instance, in introducing one or more processes and/or devices described herein.

DETAILED DESCRIPTION

Figure 1:
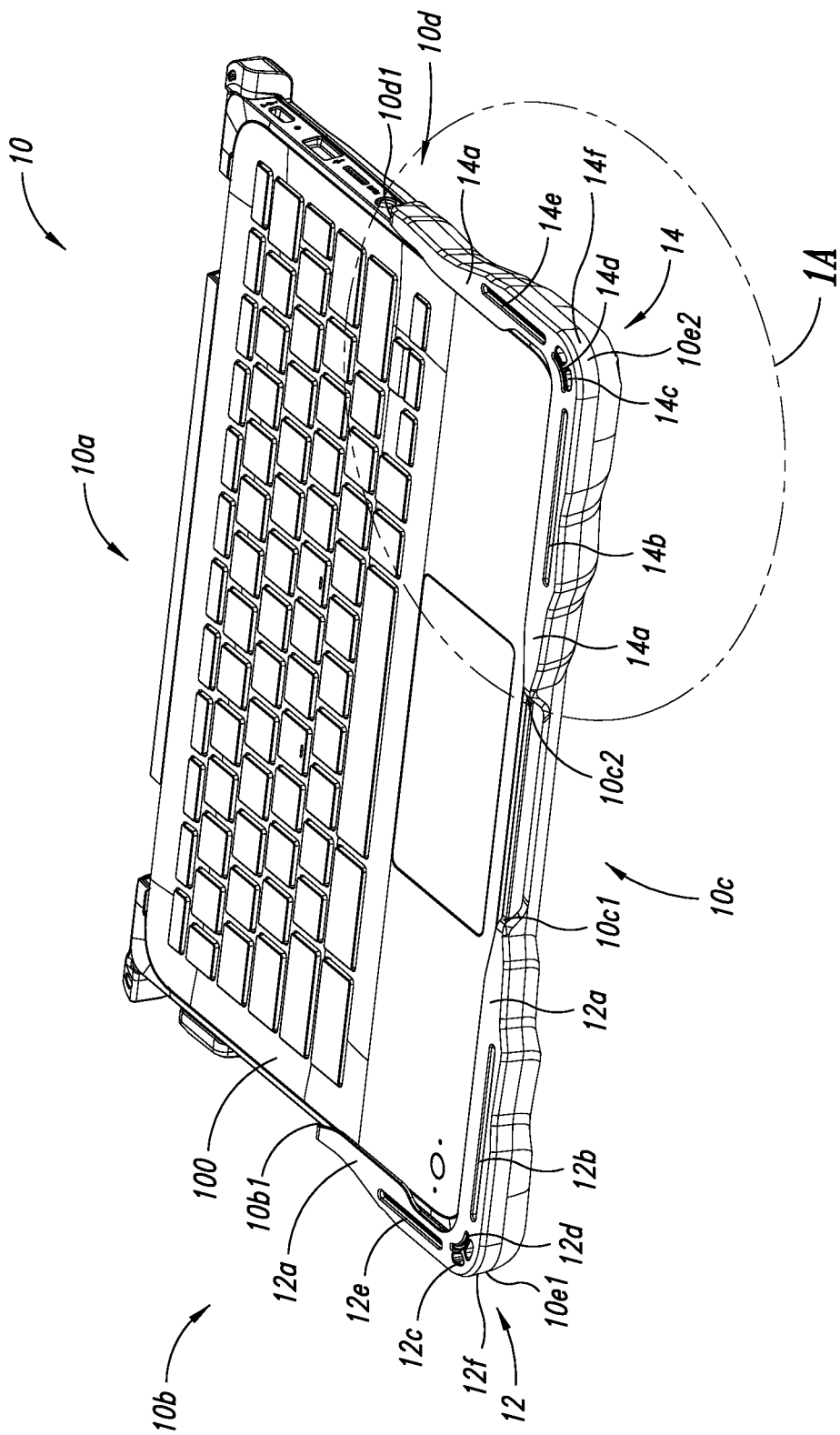
FIG. 1 is a front perspective view a case assembly for a portable electronic computing device shown containing a keyboard device.

In the following detailed description, reference is made to the accompanying drawings, which form a part hereof. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here.

Turning to FIG. 1, depicted therein is a front perspective view a case assembly 10 shown to contain keyboard device 100. The case assembly 10 is shown to include back side 10a, left side 10b, which is shown to include first location 10b1, front side 10c, which is shown to include first location 10c1 and second location 10c2, and right side 10d, which is shown to include first location 10d1. The case assembly 10 is further shown to include first corner 10e1, second corner 10e2, first cushion member 12, and second cushion member 14. The first cushion member 12 is shown to include top surface 12a, elongated trench 12b, passage 12c, curvilinear trench 12d, elongated trench 12e, and corner surface 12f. The second cushion member 14 is shown to include top surface 14a, elongated trench 14b, passage 14c, curvilinear 14d, elongated trench 14e, and corner surface 14f.

Figure 1A:
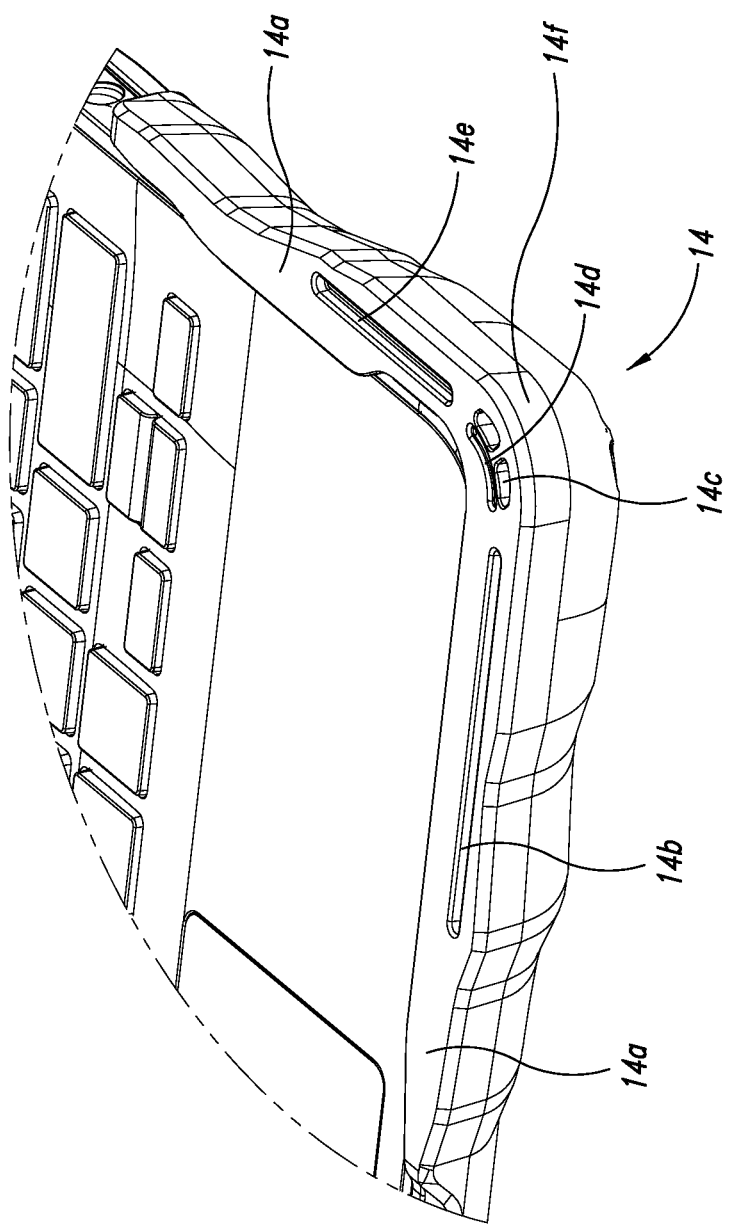
FIG. 1A is an enlarged view of the dashed-circle portion labeled "1A" of the case assembly shown in FIG. 1.

Turning to FIG. 1A, depicted therein is an enlarged view of the dashed-circle portion labeled "1A" of the case assembly shown in FIG. 1.

Figure 2:
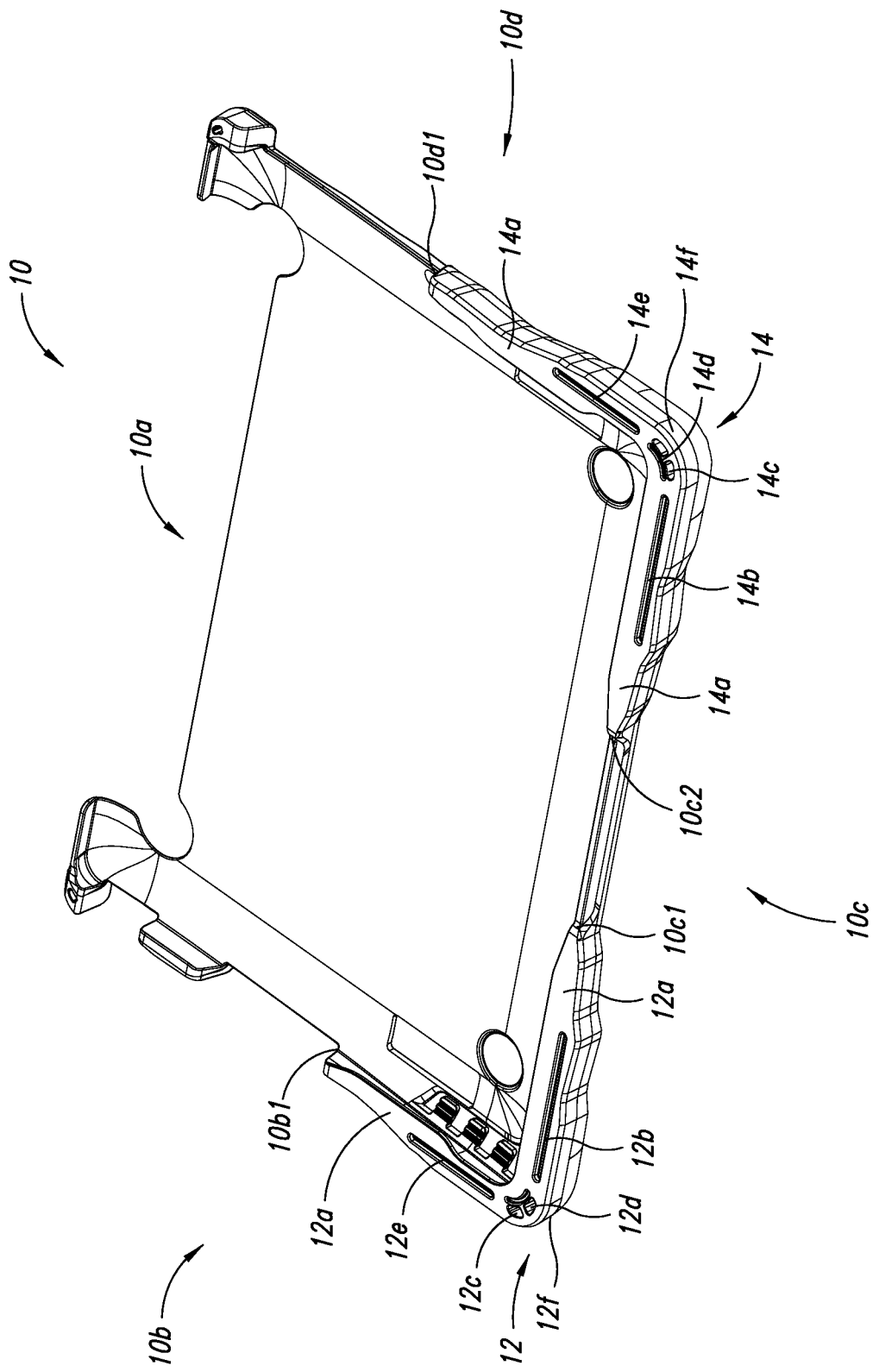
FIG. 2 is a front perspective view of the case assembly of FIG. 1 shown without containing a portable electronic computing device.

Turning to FIG. 2, depicted therein is a front perspective view of the case assembly of FIG. 1 shown without containing a portable electronic computing device.

Figure 3:
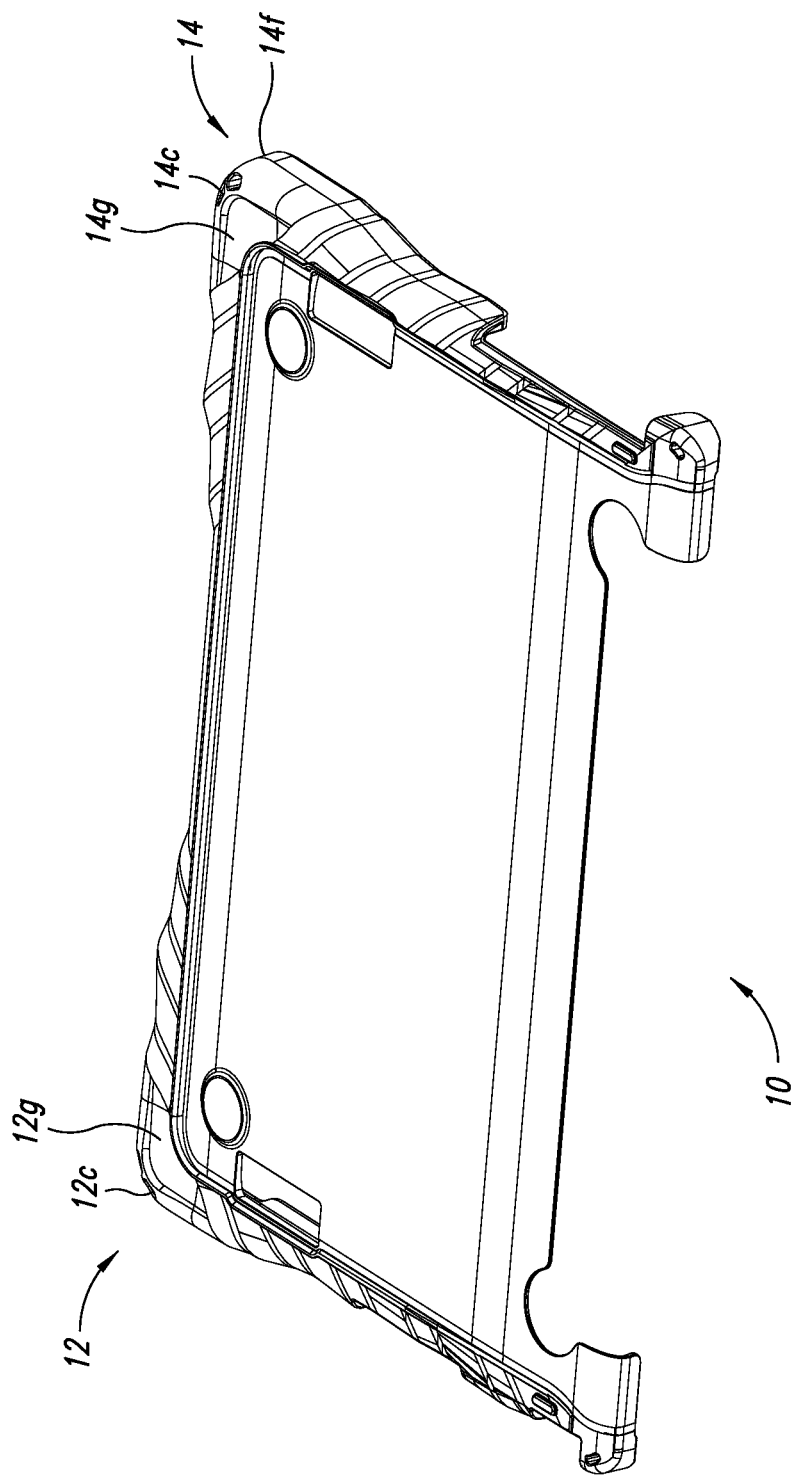
FIG. 3 is a rear perspective view of the case assembly of FIG. 1 shown without containing a portable electronic computing device.

Turning to FIG. 3, depicted therein is a rear perspective view of the case assembly of FIG. 1 shown without containing a portable electronic computing device. The first cushion member 12 is shown to include bottom surface 12g. The second cushion member 14 is shown to include bottom surface 14g.

Figure 4:
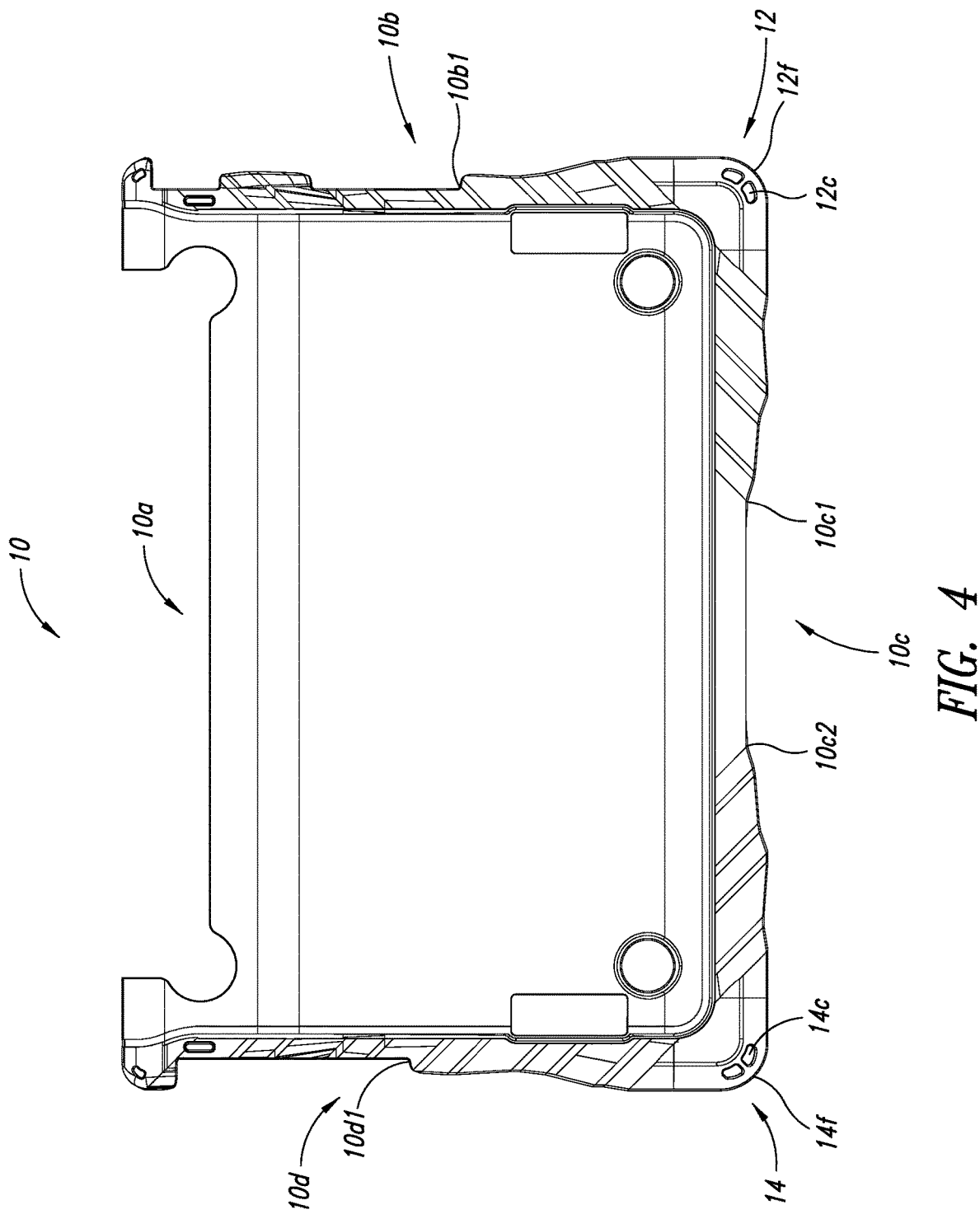
FIG. 4 is a rear plan view of the case assembly the case assembly shown in FIG. 3.

Turning to FIG. 4, depicted therein is a rear plan view of the case assembly the case assembly shown in FIG. 3.

Figure 5:
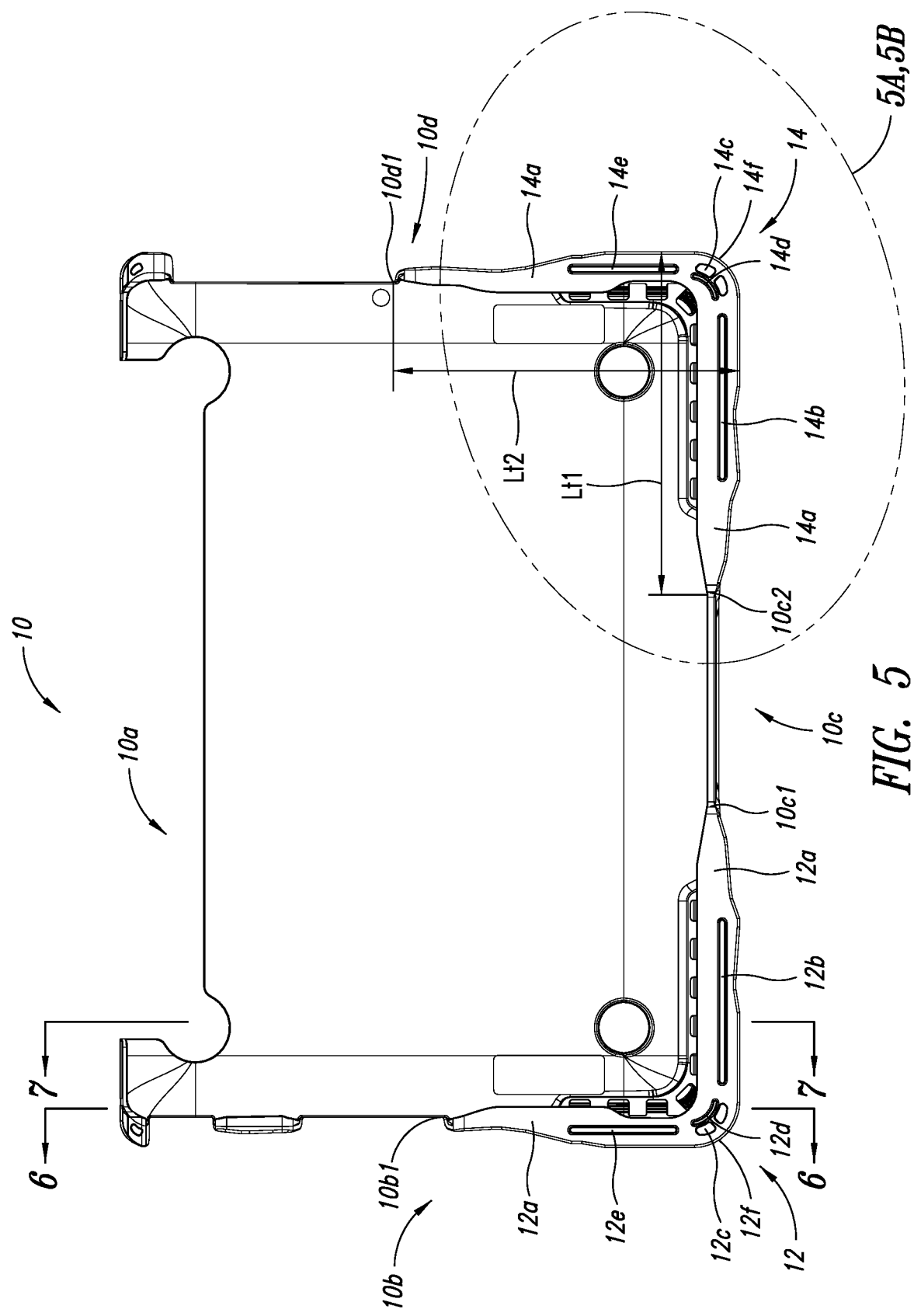
FIG. 5 is a front plan view of the case assembly the case assembly shown in FIG. 2.

Turning to FIG. 5, depicted therein is a front plan view of the case assembly the case assembly shown in FIG. 2. The second cushion member 14 is shown to extend along front side 10c for first length Lt1 and to extending along right side 10d for second length Lt2.

Figure 5A:
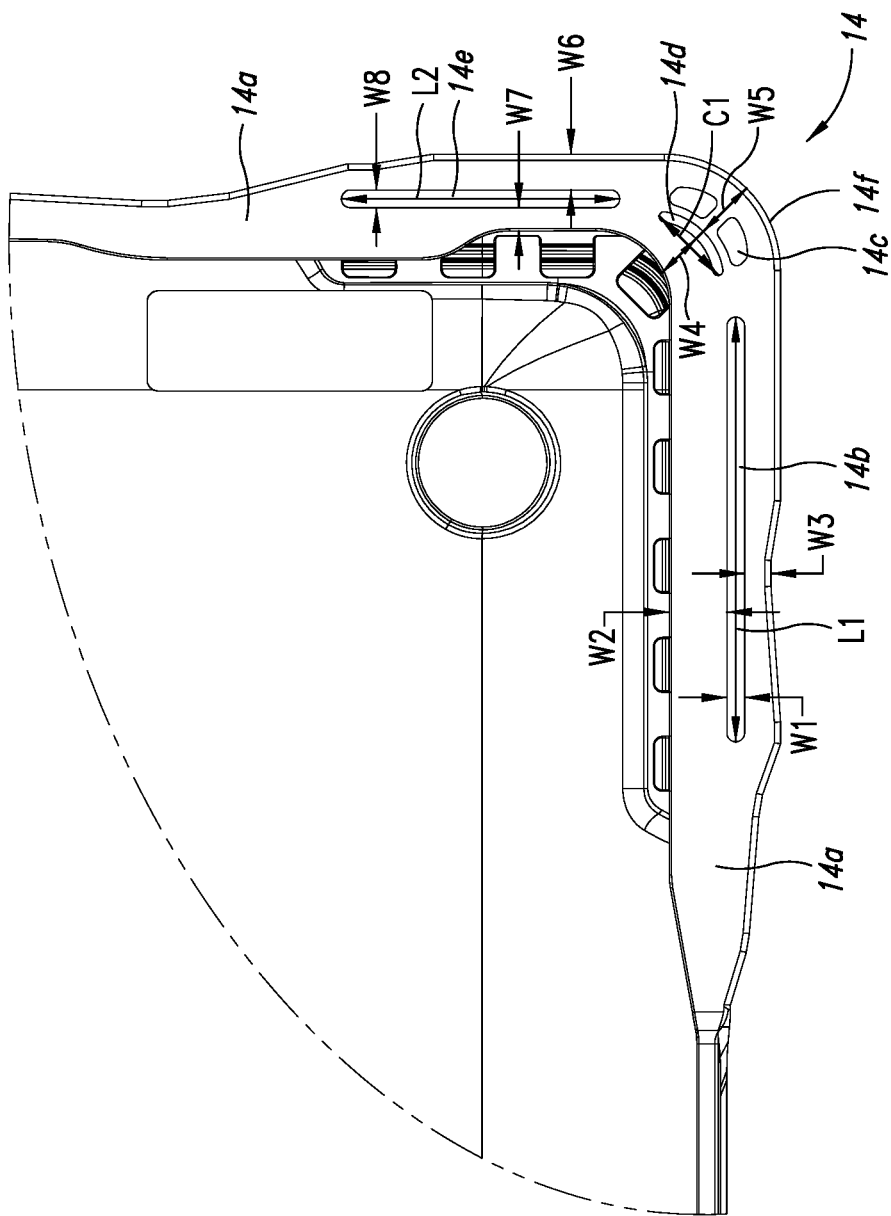
FIG. 5A is an enlarged view of the dashed-circle portion labeled "5A" of the case assembly shown in FIG. 5.

Turning to FIG. 5A, depicted therein is an enlarged view of the dashed-circle portion labeled "5A" of the case assembly shown in FIG. 5. The elongated trench 14b is shown to have first length L1 and first width W1 being positioned from inner edge of second cushion member 14 by second width W2 and being positioned from outer edge of second cushion member 14 by third width W3. The curvilinear trench 14d is shown to have first chord C1 being positioned from inner edge of second cushion member 14 by fourth width W4 and being positioned from outer edge of second cushion member 14 by fifth width W5. The second cushion member 14 is shown to have second length L2 and eighth width W8 being positioned from inner edge of second cushion member 14 by seventh width W7 and being positioned from outer edge of second cushion member 14 by sixth width W6.

Figure 5B:
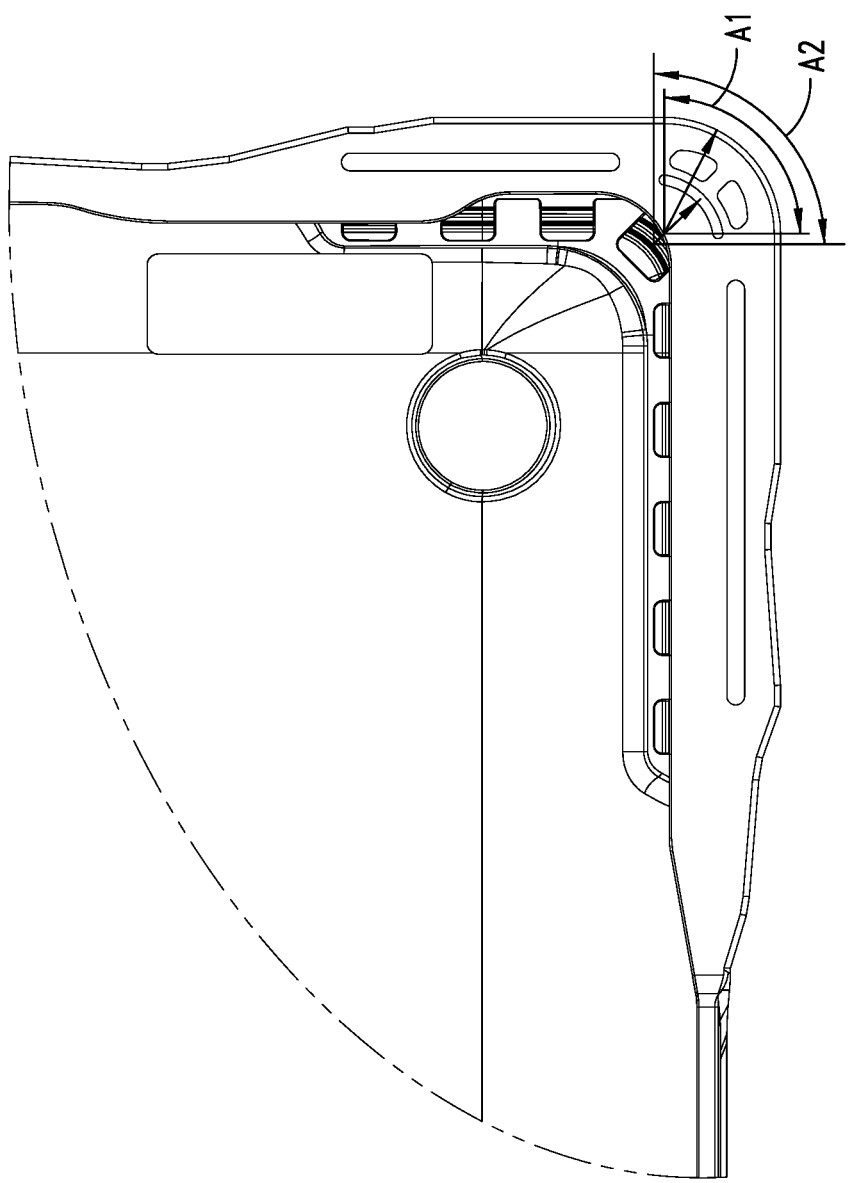
FIG. 5B is an enlarged view of the dashed-circle portion labeled "5B" of the case assembly shown in FIG. 5.

Turning to FIG. 5B, depicted therein is an enlarged view of the dashed-circle portion labeled "5B" of the case assembly shown in FIG. 5. The curvilinear trench 14d is shown to have first arc angle A1 and corner of second cushion member 14 is shown to have second arc angle A2.

Figure 6:
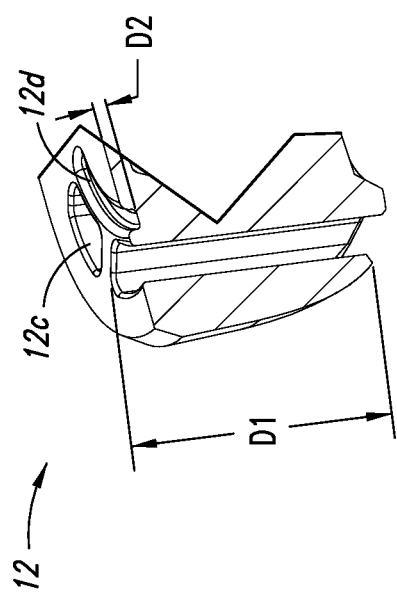
FIG. 6 is a cross-sectional side-elevational view of the laptop case assembly taken along the 6-6 cut line of FIG. 5.

Turning to FIG. 6, depicted therein is a cross-sectional side-elevational view of the laptop case assembly taken along the 6-6 cut line of FIG. 5. The passage 12c is shown to have first depth D1. The curvilinear trench 12d is shown to have second depth D2.

Figure 7:
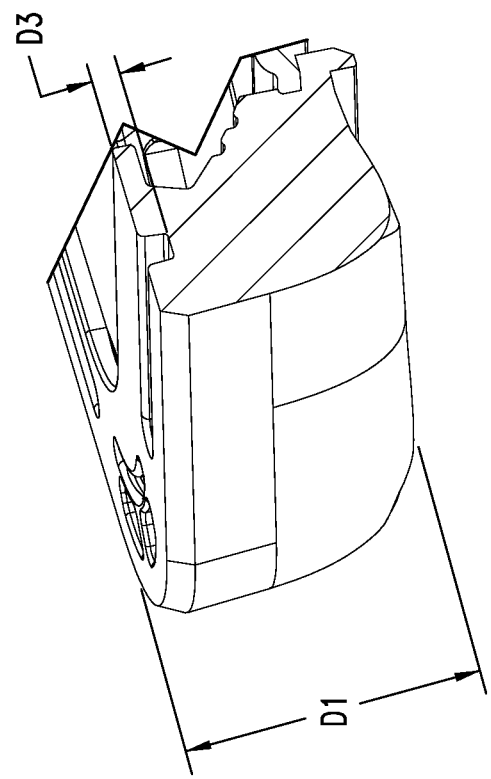
FIG. 7 is a cross-sectional side-elevational view of the laptop case assembly taken along the 7-7 cut line of FIG. 5.

Turning to FIG. 7, depicted therein is a cross-sectional side-elevational view of the laptop case assembly taken along the 7-7 cut line of FIG. 5. The elongated trench 12b is shown to have third depth D3.

Figure 8:
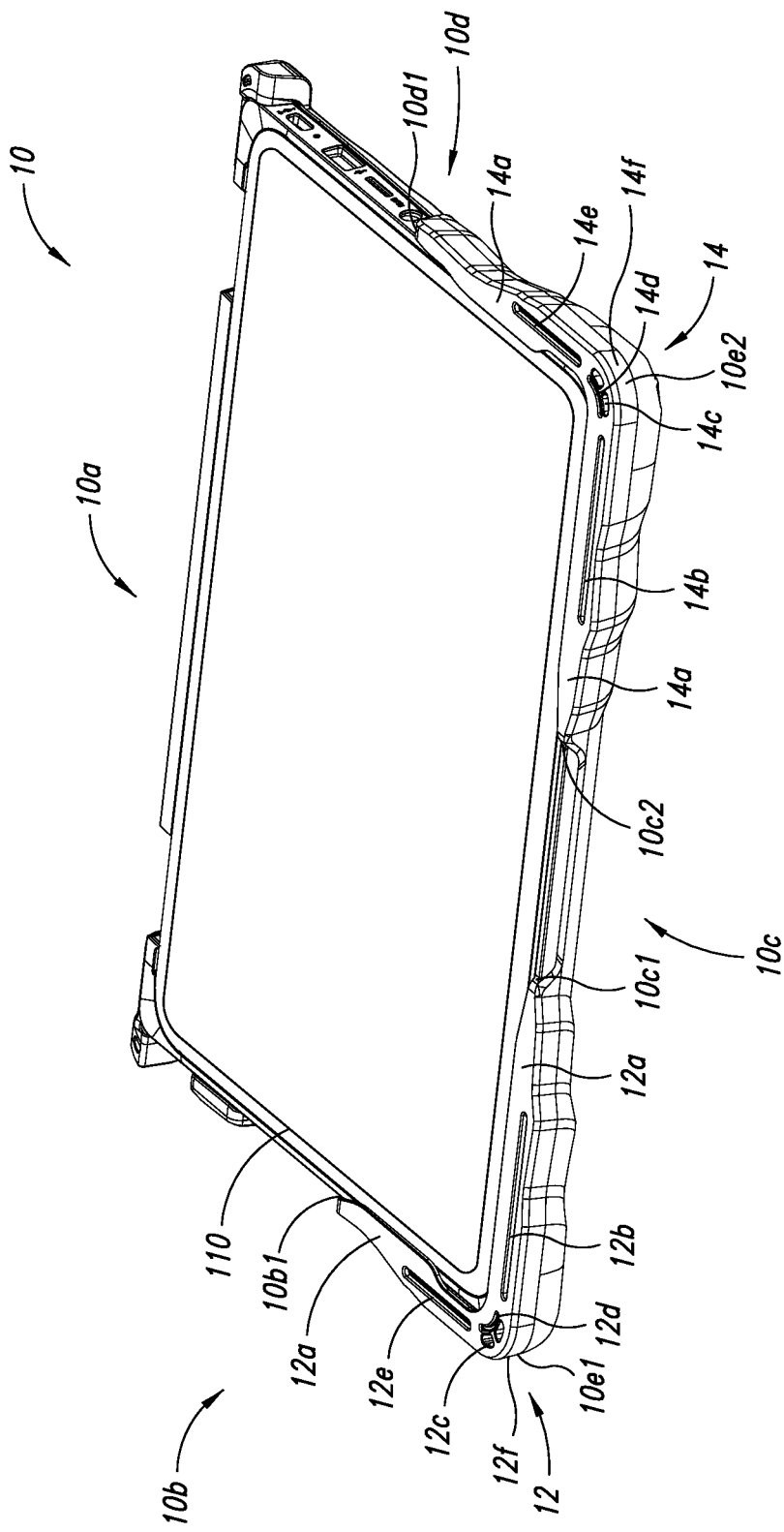
FIG. 8 is a front perspective view the case assembly of FIG. 1 for a portable electronic computing device shown containing a display device.

Turning to FIG. 8, depicted therein is a front perspective view the case assembly of FIG. 1 for a portable electronic computing device shown containing display device 110.

As shown by one or more of FIGS. 1-8, implementations of a case assembly 10 for an electronic computing device (e.g., keyboard device 100 or display device 110), the case can include a back side 10a; a left side 10b; a front side 10c; a right side 10d; a first cushion member 12 including a left side portion extending along a portion of the left side 10b, and a front side portion extending along a portion of the front side 10c, the first cushion member 12 can include a top surface 12a, a bottom surface 12g, a first thickness extending a first depth D1 from the top surface 12a, to the bottom surface 12g, and a trench (e.g., elongated trench 12e) having a depth (e.g., third depth D3) from the top surface 12a no more than partially toward the bottom surface 12g; and a second cushion member 14 including a right side portion extending along a portion of the right side 10d, and a front side portion extending along a portion of the front side 10c, the second cushion member 14 including a top surface 14a, a bottom surface 14g, a first thickness extending a first depth D1 from the top surface 14a, to the bottom surface 14g, and a trench (e.g., elongated trench 14e) having a depth (e.g., third depth D3) from the top surface 14a no more than partially toward the bottom surface 14g.

Implementations can include the first depth D1 of the first cushion member 12 being less than half the first depth D1 of the first thickness of the first cushion member 12.

Implementations can include the first depth D1 of the first cushion member 12 being less than 20% the first depth D1 of the first thickness of the first cushion member 12.

Implementations can include the first depth D1 of the first cushion member 12 being less than 5 mm.

Implementations can include the second cushion member 14 including a total front side length (e.g., first length Lt1) extending along at least 25% of the front side 10c.

Implementations can include the second cushion member 14 including a total front side length (e.g., first length Lt1) extending along the front side 10c and the trench (e.g., elongated trench 14e) of the second cushion member 14 can have a length at least 50% as long as the total front side length (e.g., first length Lt1) of the second cushion member 14.

Implementations can include the second cushion member 14 including a total front side length (e.g., first length Lt1) extending along the front side 10c and the trench (e.g., elongated trench 14e) of the second cushion member 14 can have a length at least 30% as long as the total front side length (e.g., first length Lt1) of the second cushion member 14.

Implementations can include the second cushion member 14 including an exterior edge (e.g., exterior edge surface 14f), and wherein the trench (e.g., elongated trench 14b) of the second cushion member 14 can have a width (e.g., first width W1) and can be spaced from the exterior edge (e.g., exterior edge surface 140 of the second cushion member 14 at least 75% of the width (e.g., first width W1) of width (e.g., first width W1).

Implementations can include the second cushion member 14 can have a width (e.g., the sum of first width W1, second width W2, and third width W3) and wherein the trench (e.g., elongated trench 14b) of the second cushion member 14 can have a width (e.g., first width W1) less than half of the width of the width of the second cushion member 14 (e.g., the sum of first width W1, second width W2, and third width W3).

Implementations can include the second cushion member 14 can have a width (e.g., the sum of first width W1, second width W2, and third width W3) and wherein the trench (e.g., elongated trench 14b) of the second cushion member 14 can have a width (e.g., first width W1) less than a quarter of the width of the width of the second cushion member 14 (e.g., the sum of first width W1, second width W2, and third width W3).

Implementations can include the second cushion member 14 including a plurality trenches (e.g., elongated trench 14b and elongated trench 14e) with depths (e.g., third depth D3) from the top surface 14a no more than partially toward the bottom surface 14g.

Implementations can include the second cushion member 14 including a curvilinear trench (e.g., curvilinear 14d) with a depth (e.g., second depth D2) from the top surface 14a no more than partially toward the bottom surface 14g.

Implementations can include the curvilinear trench (e.g., curvilinear 14d) of the second cushion member 14 is shaped according to a first arc angle (e.g., first arc angle A1) and wherein the second cushion member 14 can include a corner shaped according to a second arc angle (e.g., second arc angle A2), the first arc angle (e.g., first arc angle A1) being within 20% of the second arc angle (e.g., second arc angle A2).

Implementations can include the first cushion member 12 including a passage 12c extending from the top surface 12a of the first cushion member 12 to the bottom surface 12g of the first cushion member 12.

Implementations can include the trench (e.g., curvilinear trench 12d) of the first cushion member 12 can have a width (e.g. similar to width of curvilinear trench 12d) and can be spaced from the passage 12c of the first cushion member 12 less than or equal to the width of the trench (e.g., curvilinear trench 12d).

Implementations can include the first cushion member 12 being at least partially made from thermoplastic polyurethane.

As shown by one or more of FIGS. 1-8, implementations of a case assembly 10 for an electronic computing device (e.g., keyboard device 100 or display device 110), the case can include a first side (e.g., left side 10b); a second side (e.g., front side 10c); a third side (e.g., right side 10d); a first cushion member 12 including a first side portion extending along a portion of the first side (e.g., left side 10b), and a second side portion extending along a portion of the second side (e.g., front side 10c), the first cushion member 12 including a first surface (e.g., top surface 12a), a second surface (e.g., bottom surface 12g), a first thickness extending a first depth D1 from the first surface (e.g., top surface 12a), to the second surface (e.g., bottom surface 12g), and a plurality of trenches (e.g., elongated trench 12e) each having a depth (e.g., third depth D3) from the first surface (e.g., top surface 12a) partially toward the second surface (e.g., bottom surface 12g); and a second cushion member 14 including a first side portion extending along a portion of the third side (e.g., right side 10d), and a second side portion extending along a portion of the second side (e.g., front side 10c) the second cushion member 14 including a first surface (e.g., top surface 14a), a second surface (e.g., bottom surface 14g), a first thickness extending a first depth D1 from the first surface (e.g., top surface 14a), to the second surface (e.g., bottom surface 14g), and a plurality of trenches (e.g., elongated trench 14e) each having a depth (e.g., third depth D3) from the first surface (e.g., top surface 14a) no more than partially toward the second surface (e.g., bottom surface 14g).

Implementations can include the second cushion member 14 includes a total second side length (e.g., first length Lt1) extending along the second side (e.g., front side 10c) and at least one of the plurality of trenches (e.g., elongated trench 14e) of the second cushion member 14 has a length at least 50% as long as the total second side length (e.g., first length Lt1) of the second cushion member 14.

As shown by one or more of FIGS. 1-8, implementations of a case assembly 10 for an electronic computing device (e.g., keyboard device 100 or display device 110), the case can include a side (e.g., front side 10c); a cushion member (e.g., first cushion member 12) including a side portion extending along a portion of the side (e.g., front side 10c), the cushion member (e.g., first cushion member 12) including a first surface (e.g., top surface 12a), a second surface (e.g., bottom surface 12g), a first thickness extending a depth (e.g., first depth D1) from the first surface (e.g., top surface 12a), to the second surface (e.g., bottom surface 12g), and at least one trench (e.g., elongated trench 12e) having a depth (e.g., third depth D3) from the first surface (e.g., top surface 12a) partially toward the second surface (e.g., bottom surface 12g) without penetrating the second surface (e.g., bottom surface 12g).

Implementations can include the cushion member (e.g., second cushion member 14) has a width (e.g., the sum of first width W1, second width W2, and third width W3) and wherein the at least one trench (e.g., elongated trench 14b) of the cushion member (e.g., second cushion member 14) has a width (e.g., first width W1) less than a quarter of the width of the width (e.g., the sum of first width W1, second width W2, and third width W3) of the cushion member (e.g., second cushion member 14).

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms unless context dictates otherwise. For example, the phrase "A or B" will be typically understood to include the possibilities of "A" or "B" or "A and B."

With respect to the appended claims, those skilled in the art will appreciate that recited operations therein may generally be performed in any order. Also, although various operational flows are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

What is claimed is:

1. A case assembly for an electronic computing device, the case comprising:
    a back side;
    a left side;
    a front side;
    a right side;
    a first cushion member including
        a left side portion extending along a portion of the left side, and
        a front side portion extending along a portion of the front side,
    the first cushion member including
        a top surface,
        a bottom surface,
        a first thickness extending a first depth from the top surface, to the bottom surface, and
        a trench having a depth from the top surface no more than partially toward the bottom surface; and
    a second cushion member including
        a right side portion extending along a portion of the right side, and
        a front side portion extending along a portion of the front side,
    the second cushion member including
        a top surface,
        a bottom surface,
        a first thickness extending a first depth from the top surface, to the bottom surface, and
        a trench having a depth from the top surface no more than partially toward the bottom surface.

2. The case assembly of claim 1 wherein the first depth of the first cushion member is less than half the first depth of the first thickness of the first cushion member.

3. The case assembly of claim 1 wherein the first depth of the first cushion member is less than 20% the first depth of the first thickness of the first cushion member.

4. The case assembly of claim 1 wherein the first depth of the first cushion member is less than 5 mm.

5. The case assembly of claim 1 wherein the second cushion member includes a total front side length extending along at least 25% of the front side.

6. The case assembly of claim 1 wherein the second cushion member includes a total front side length extending along the front side and the trench of the second cushion member has a length at least 50% as long as the total front side length of the second cushion member.

7. The case assembly of claim 1 wherein the second cushion member includes a total front side length extending along the front side and the trench of the second cushion member has a length at least 30% as long as the total front side length of the second cushion member.

8. The case assembly of claim 1 wherein the second cushion member includes an exterior edge, and wherein the trench of the second cushion member has a width and is spaced from the exterior edge of the second cushion member at least 75% of the width of width.

9. The case assembly of claim 1 wherein the second cushion member has a width and wherein the trench of the second cushion member has a width less than half of the width of the width of the second cushion member.

10. The case assembly of claim 1 wherein the second cushion member has a width and wherein the trench of the second cushion member has a width less than a quarter of the width of the width of the second cushion member.

11. The case assembly of claim 1 wherein the second cushion member includes a plurality trenches with depths from the top surface no more than partially toward the bottom surface.

12. The case assembly of claim 1 wherein the second cushion member includes a curvilinear trench with a depth from the top surface no more than partially toward the bottom surface.

13. The case assembly of claim 12 wherein the curvilinear trench of the second cushion member is shaped according to a first arc angle and wherein the second cushion member includes a corner shaped according to a second arc angle, the first arc angle being within 20% of the second arc angle.

14. The case assembly of claim 1 wherein the first cushion member includes a passage extending from the top surface of the first cushion member to the bottom surface of the first cushion member.

15. The case assembly of claim 14 wherein the trench of the first cushion member has a width and is spaced from the passage of the first cushion member less than or equal to the width of the trench.

16. The case assembly of claim 1 wherein the first cushion member being at least partially made from thermoplastic polyurethane.

17. A case assembly for an electronic computing device, the case comprising:
   a first side;
   a second side;
   a third side;
   a first cushion member including
      a first side portion extending along a portion of the first side, and
      a second side portion extending along a portion of the second side,
   the first cushion member including
      a first surface,
      a second surface,
      a first thickness extending a first depth from the first surface, to the second surface, and
      a plurality of trenches each having a depth from the first surface partially toward the second surface; and
   a second cushion member including
      a first side portion extending along a portion of the third side, and
      a second side portion extending along a portion of the second side,
   the second cushion member including
      a first surface,
      a second surface,
      a first thickness extending a first depth from the first surface, to the second surface, and
      a plurality of trenches each having a depth from the first surface no more than partially toward the second surface.

18. The case assembly of claim 17 wherein the second cushion member includes a total second side length extending along the second side and at least one of the plurality of trenches of the second cushion member has a length at least 50% as long as the total second side length of the second cushion member.

19. A case assembly for an electronic computing device, the case comprising:
   a side;
   a cushion member including
      a side portion extending along a portion of the side,
   the cushion member including
      a first surface,
      a second surface,
      a first thickness extending a depth from the first surface, to the second surface, and
      at least one trench having a depth from the first surface partially toward the second surface without penetrating the second surface.

20. The case assembly of claim 19 wherein the cushion member has a width and wherein the at least one trench of the cushion member has a width less than a quarter of the width of the width of the cushion member.

* * * * *